US010957808B2

(12) United States Patent
Lee et al.

(10) Patent No.: US 10,957,808 B2
(45) Date of Patent: Mar. 23, 2021

(54) FLEXIBLE DOUBLE-JUNCTION SOLAR CELL

(71) Applicant: Korea Research Institute of Standards and Science, Daejeon (KR)

(72) Inventors: Sang-Jun Lee, Daejeon (KR); Jun-Oh Kim, Yongin-si (KR); Yeongho Kim, Wonju-si (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 0 days.

(21) Appl. No.: 16/642,338

(22) PCT Filed: Sep. 17, 2018

(86) PCT No.: PCT/KR2018/010932
§ 371 (c)(1),
(2) Date: Feb. 26, 2020

(87) PCT Pub. No.: WO2019/107718
PCT Pub. Date: Jun. 6, 2019

(65) Prior Publication Data
US 2020/0185553 A1 Jun. 11, 2020

(30) Foreign Application Priority Data

Nov. 28, 2017 (KR) .................. 10-2017-0159784

(51) Int. Cl.
*H01L 31/0392* (2006.01)
*H01L 31/0216* (2014.01)
(Continued)

(52) U.S. Cl.
CPC .. *H01L 31/03926* (2013.01); *H01L 31/02168* (2013.01); *H01L 31/0725* (2013.01); *H01L 31/0735* (2013.01); *H01L 31/184* (2013.01)

(58) Field of Classification Search
CPC .............. H01L 31/1892; H01L 31/056; H01L 31/022425; H01L 31/054; H01L 31/0504; H01L 31/03046; H01L 31/18; Y02E 10/52
See application file for complete search history.

(56) References Cited

U.S. PATENT DOCUMENTS 7,994,419 B2   8/2011 Pan et al.
2009/0038678 A1 2/2009 Pan et al.
(Continued)

FOREIGN PATENT DOCUMENTS

JP       2014199915 A   10/2014
KR    1020100047246 A    5/2010
(Continued)

OTHER PUBLICATIONS

Coupling based Huygens meta-atom utilizing bilayer complementary plasmonic structure for light manipulation, Optics Express, 2017.*
(Continued)

*Primary Examiner* — Matthew T Martin
(74) *Attorney, Agent, or Firm* — Andrew D. Fortney; Central California IP Group, P.C.

(57) ABSTRACT

A flexible double-junction solar cell includes a flexible substrate including a lower electrode layer, an InGaAs solar cell disposed to be in contact with the lower electrode layer of the flexible substrate, and a GaAs solar cell disposed on the InGaAs solar cell and connected to the InGaAs solar cell in series. The GaAs solar cell includes a metal nanodisk array disposed on a lower surface thereof and a void array, aligned with the metal nanodisk array, is disposed below the metal nanodisk array.

7 Claims, 17 Drawing Sheets

(51) Int. Cl.
*H01L 31/0725* (2012.01)
*H01L 31/0735* (2012.01)
*H01L 31/18* (2006.01)

(56) References Cited

U.S. PATENT DOCUMENTS

| | | |
|---|---|---|
| 2009/0044860 A1 | 2/2009 | Pan et al. |
| 2011/0290312 A1 | 12/2011 | Agui et al. |
| 2011/0318866 A1 | 12/2011 | Pan et al. |
| 2014/0060631 A1 | 3/2014 | Agui et al. |
| 2016/0005911 A1* | 1/2016 | Sato ................... H01L 31/1892 136/255 |
| 2019/0157493 A1 | 5/2019 | Lee et al. |

FOREIGN PATENT DOCUMENTS

| | | |
|---|---|---|
| KR | 101193810 B1 | 10/2012 |
| KR | 101783971 B1 | 10/2017 |

OTHER PUBLICATIONS

International Search Report, International Application No. PCT/KR2018/010932, dated Dec. 4, 2018; 4 pgs.

\* cited by examiner

FLEXIBLE DOUBLE-JUNCTION SOLAR CELL

CROSS-REFERENCE TO RELATED APPLICATIONS

This application is a continuation of and claims priority to PCT/KR2018/010932 filed on Sep. 17, 2018, which claims priority to Korea Patent Application No. 10-2017-0159784 filed on Nov. 28, 2017, the entireties of which are both hereby incorporated by reference.

TECHNICAL FIELD

The present disclosure relates to a double-junction compound solar cell, and more particularly, to a double-junction compound solar cell having a surface plasmon resonance structure.

BACKGROUND

A multi-junction solar cell based on a III-V compound semiconductor has a direct-type energy bandgap and a high optical absorption coefficient, and thus, may significantly efficiently absorb a solar spectrum. In addition, a compound semiconductor solar cell is a next-generation new and renewable energy device, capable of achieving a significantly high photoelectric conversion efficiency of 40 percent or more through an optimal bandgap combination.

A currently commercialized GaP/GaAs/Ge triple junction solar cell includes each epitaxial layer grown on a germanium (Ge) substrate with lattice matching and has a photoelectric conversion efficiency of about 30% under non-concentrated conditions.

More optimized bandgap combinations, such as a quadruple junction, a quintuple junction, and the like, are required to further improve the conversion efficiency of solar cells. To this end, growth of an epitaxial layer having lattice mismatching with a substrate is required. Epitaxial growth in lattice mismatch conditions may result in a crystalline defect to reduce short-circuit current density and open-circuit voltage of a solar cell. Accordingly, there is a need for special attention during growth of a solar cell structure.

Recently, an attempt has been actively made as a novel method of improving efficiency of solar cells. According to the attempt, metal nanoparticles are introduced to a surface of a solar cell attempts to improve an optical dispersion effect caused by the nanoparticles and optical absorption of a solar cell is significantly increased through occurrence of plasmon resonance. The plasmon resonance is a phenomenon, in which free electrons in a metal excited by incident light behave collectively, and may be classified into localized surface plasmon resonance and propagating surface plasmon resonance. At an interface between metal nanoparticles and a semiconductor, a strong electric field is generated by such surface plasmon resonance to allow the semiconductor to absorb a greater amount of light. In addition, light absorption band and light absorption efficiency may be selectively modulated by adjusting a dielectric constant, a shape, an arrangement cycle, and the like, of the metal nanoparticles.

SUMMARY

An aspect of the present disclosure is to provide a double-junction solar cell in which a metal nanodisk array and a void, aligned with the metal nanodisk array, are disposed between a lower InGaAs solar cell and an upper GaAs solar cell, connected in series, to provide improved optical reflection characteristics and improved electrical characteristics.

An aspect of the present disclosure is to provide a method of manufacturing a double-junction solar cell in which a metal nanodisk array and a void, aligned with the metal nanodisk array, are formed between a lower InGaAs solar cell and an upper GaAs solar cell connected in series.

According to an aspect of the present disclosure, a double-junction solar cell includes a flexible substrate including a lower electrode layer, an InGaAs solar cell disposed to be in contact with the lower electrode layer of the flexible substrate, and a GaAs solar cell disposed on the InGaAs solar cell and connected to the InGaAs solar cell in series. The GaAs solar cell includes a metal nanodisk array disposed on a lower surface thereof, and a void array, aligned with the metal nanodisk array, is disposed below the metal nanodisk array.

In an example embodiment, the InGaAs solar cell may include a lower metal adhesive layer disposed on the lower electrode layer, a semiconductor adhesive layer disposed on the lower metal adhesive layer, an upper metal adhesive layer disposed on the semiconductor adhesive layer, an n+-InP contact layer disposed on the upper metal adhesive layer, an n-InGaAs base layer disposed on the n+-InP contact layer, a $p^+$-InGaAs emitter layer disposed on the n-InGaAs base layer, a $p^+$-InP window layer disposed on the $p^+$-InGaAs emitter layer, and a $p^{++}$-InGaAs contact layer disposed on the $p^+$-InP window layer.

In an example embodiment, the GaAs solar cell may include an $n^+$-GaAs contact layer disposed on the $p^{++}$-InGaAs contact layer of the InGaAs solar cell, an $n^+$-InGaP back-surface field layer disposed on the $n^+$-GaAs contact layer, an n-GaAs base layer disposed on the $n^+$-InGaP back surface field layer, a $p^+$-GaAs emitter layer disposed on the n-GaAs base layer, a $p^+$-InGaP window layer disposed on the $p^+$-GaAs emitter layer, and a $p^+$-GaAs contact layer disposed on the $p^+$-InGaP window layer. The metal nanodisk array may be disposed on a lower surface of the $n^+$-GaAs contact layer, and the void array may be disposed between the $p^{++}$-InGaAs contact layer and the metal nanodisk array.

In an example embodiment, the $p^+$-GaAs contact layer may have a depressed portion. The flexible double-junction solar cell may further include an antireflective coating film, filling the depressed portion, and an upper electrode layer disposed on the $p^+$-GaAs contact layer.

In an example embodiment, the metal nanodisk array may include gold (Au). The metal nanodisk array may have a thickness of 40 nm to 60 nm. The metal nanodisk array may have a period 50 nm to 200 nm. The metal nanodisk array may have a diameter of 30 nm to 120 nm.

According to an aspect of the present disclosure, a method of manufacturing a double-junction solar cell includes preparing a GaAs solar cell including a GaAs buffer layer, an AlAs sacrificial layer, a $p^+$-GaAs contact layer, a $p^+$-InGaP window layer, a $p^+$-GaAs emitter layer, an n-GaAs base layer, an $n^+$-InGaP back surface field layer, and an $n^+$-GaAs contact layer on an $n^+$-GaAs substrate, forming a metal nanodisk array on a lower surface of a hole array in the n-GaAs contact layer of the GaAs solar cell and forming a void in an upper portion of the metal nanodisk array, preparing an InGaAs solar cell including an InP buffer layer, an AlAs auxiliary sacrificial layer, a $p^{++}$-InGaAs contact layer, a $p^+$-InP window layer, a $p^+$-InGaAs emitter layer, an n-InGaAs base layer, and an $n^+$-InP contact layer sequentially stacked on an n+-InP substrate, sequentially stacking an upper metal adhesive layer, a semiconductor adhesive layer, and a lower metal adhesive layer on the n+-InP contact layer of the InGaAs solar cell, bonding the lower metal adhesive layer, stacked on the InGaAs solar cell, to a flexible substrate including a lower electrode layer, removing the AlAs auxiliary sacrificial layer of the InGaAs solar cell to expose the p++-InGaAs contact layer, performing wafer bonding on the p++-InGaAs contact layer of the InGaAs solar cell to the n+-GaAs contact layer of the GaAs solar cell to form a double-junction solar cell, and removing the AlAs sacrificial layer of the GaAs solar cell from the double-junction solar cell to expose the p+-GaAs contact layer.

In an example embodiment, the method may further include locally forming an upper electrode layer on the p+-GaAs contact layer, and forming an antireflective coating film in a depressed portion where the p+-GaAs contact layer is locally removed

BRIEF DESCRIPTION OF THE DRAWINGS

The above and other aspects, features, and advantages of the present disclosure will be more clearly understood from the following detailed description, taken in conjunction with the accompanying drawings.

DETAILED DESCRIPTION

Figure 1:
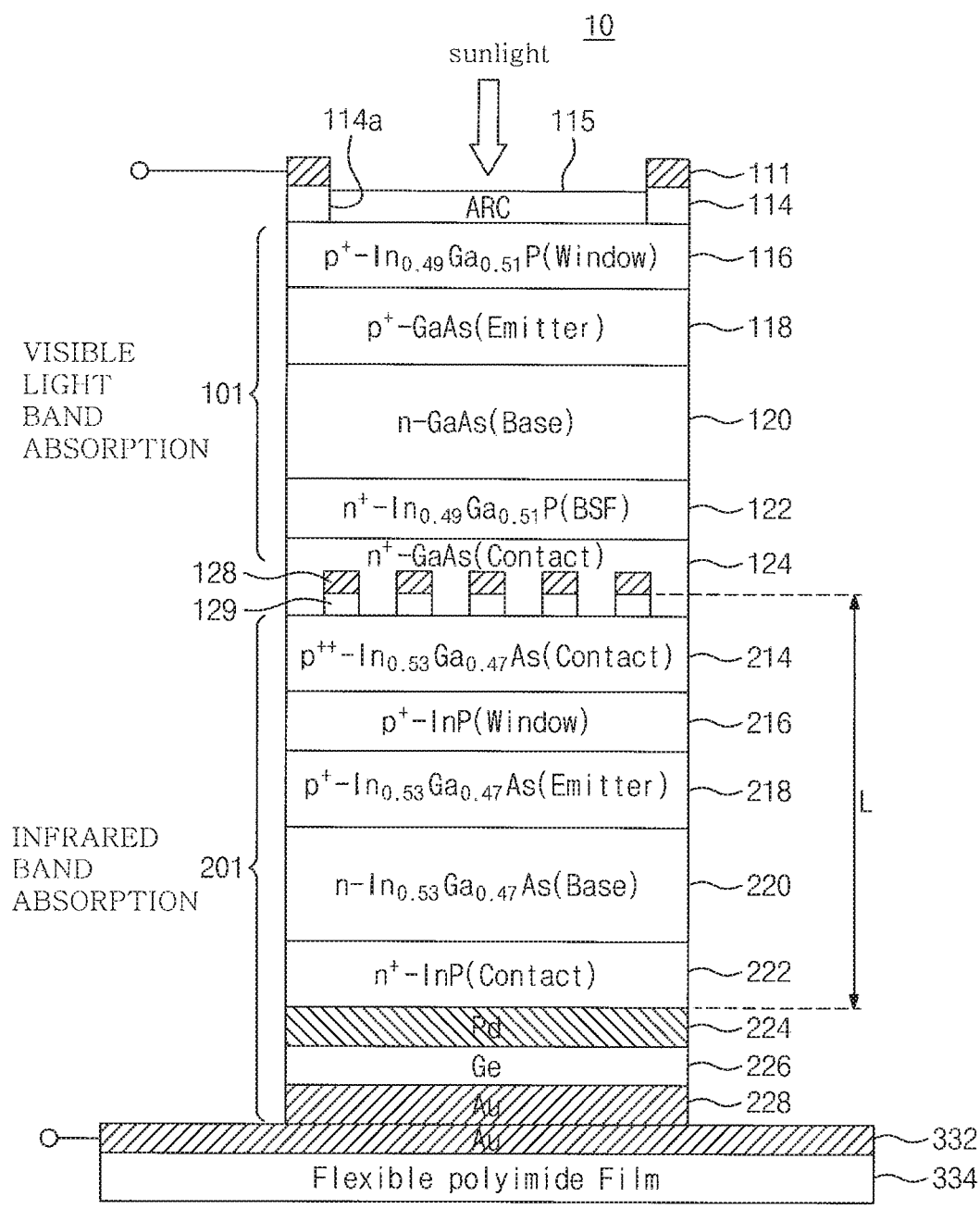
FIG. 1 is a conceptual diagram illustrating a double-junction solar cell according an example embodiment of the present disclosure.

According to an example embodiment, a high-efficiency flexible GaAs/InGaAs double-junction solar cell having a lattice mismatching structure is provided using a surface plasmon resonance structure manufacturing technology and a wafer bonding technology. High-quality epitaxial growth of epitaxial thin films of a single-junction GaAs solar cell and a single-junction InGaAs solar cell, required to manufacture a double-junction solar cell, is performed on GaAs and InP substrates with lattice matching, respectively.

A GaAs single-junction solar cell structure is a reverse growth structure in which an AlAs sacrificial layer is included to separate a selected thin film from a substrate. An InGaAs single-junction solar cell structure is a reverse growth structure in which an AlAs auxiliary sacrificial layer is included to separate the selected thin film layer from the substrate.

A flexible GaAs/InGaAs double-junction solar cell may be manufactured on a polyimide film on which a lower electrode layer is deposited. In the sunlight incident on the flexible double-junction solar cell, light in a visible light band (300 to 800 nm) is mainly absorbed by an n-GaAs base layer of an upper GaAs cell. Light in an infrared band (800 to 1800 nm) is absorbed by an n-InGaAs base layer of a lower InGaAs cell. Light, not being absorbed by the n-GaAs base layer, is reflected by a lower metal layer disposed on a lower surface of the flexible double-junction solar cell. The lower metal layer is disposed on a polyimide film and has a high reflectance of 90% or more. Light, incident from the lower metal layer, is reflected to the flexible double-junction solar cell. The reflected light is reabsorbed in the n-InGaAs base layer of the flexible double-junction solar cell to contribute to improvement of photocurrent.

A flexible GaAs/InGaAs double-junction solar cell according to an example embodiment is disposed on a flexible substrate such as a polyimide film to be advantageous for mounting and processing.

In the flexible GaAs/InGaAs double-junction solar cell according to an example embodiment, an InGaAs solar cell has a Fabry-Perot cavity structure by a lower electrode layer and a metal nanodisk array. Therefore, light having a specific wavelength ($\lambda=2$ nL/m, $\lambda$: resonance wavelength, n: effective refractive index of lower InGaAs solar cell thin film, L: overall thickness of solar cell thin film, m: 1, 2, 3, . . . ) causes Fabry-Perot resonance through a design for optimal thickness of a thin film of an InGaAs solar cell. Thus, optical absorption efficiency of the lower InGaAs solar cell may be improved. The specific wavelength may be proximate to 1000 nm.

According to an example embodiment, a metal nanodisk array may be inserted between the GaAs solar cell (an upper cell) and the InGaAs solar cell (a lower cell) to increase wavelength absorption in a visible light region, a main absorption band of the GaAs solar cell, and to increase wavelength absorption of an infrared region, a main absorption band of the InGaAs solar cell.

According to an example embodiment, the metal nanodisk array, disposed on the InGaAs solar cell, may increase reflectance within a wavelength range of 300 to 550 nm and reduce the reflectance in a region of 780 to 1800 nm.

Hereinafter, embodiments will be described in detail with reference to the accompanying drawings. While the disclosure is subject to various modifications and alternative forms, specific embodiments thereof are shown by way of example in the drawings and are explained in detail in the description. However, the disclosure should not be construed as being limited to the embodiments set forth herein, but on the contrary, the disclosure is intended to cover all modifications, equivalents, and alternatives falling within the spirit and scope of the embodiments. In the drawings, the sizes or shapes of elements may be exaggerated for convenience and clarity of description.

It may be understood that, although the terms "first," "second," etc. may be used herein to describe various elements, these elements are not to be construed as being limited by these terms. These terms are generally only used to distinguish one element from another. In addition, terms particularly defined in consideration of the construction and operation of the embodiments are used only to describe the embodiments, but do not define the scope of the embodiments.

It will be understood that when an element is referred to as being "on" or "under" another element, it can be directly on/under the element, or one or more intervening elements may also be present. When an element is referred to as being "on" or "under," "under the element" as well as "on the element" can be included based on the element.

In addition, relational terms, such as "on/upper part/above" and "under/lower part/below," are used only to distinguish between one subject or element and another subject or element, without necessarily requiring or involving any physical or logical relationship or sequence between the subjects or elements.

FIG. 1 is a conceptual diagram illustrating a double-junction solar cell according an example embodiment.

Referring to FIG. 1, a flexible double-junction solar cell 10 includes a flexible substrate 334 including a lower electrode layer 332, an InGaAs solar cell 201 disposed to be in contact with the lower electrode layer 332 of the flexible substrate 334, and a GaAs solar cell 101 disposed on the InGaAs solar cell 201 and connected to the InGaAs solar cell 201 in series. The GaAs solar cell 101 includes a metal nanodisk array 128 disposed on a lower surface thereof. A void array 129, aligned with the metal nanodisk array 128, is disposed below the metal nanodisk array 128.

The flexible substrate 334 may be a flexible polyimide film, a flexible plastic film, or a flexible metal film.

The lower electrode layer 332 may be disposed on the flexible substrate 334. The lower electrode layer 332 may be a gold (Au) thin film. The lower electrode layer 332 may be connected to an external circuit.

The InGaAs solar cell 201 may be disposed on the lower electrode layer 332. The InGaAs solar cell 201 includes a lower metal adhesive layer 228 disposed on the lower electrode layer 332, a semiconductor adhesive layer 226 disposed on the lower metal adhesive layer 228, an upper metal adhesive layer 224 disposed on the semiconductor adhesive layer 226, an n$^+$-InP contact layer 222 disposed on the upper metal adhesive layer 224, an n-InGaAs base layer 220 disposed on the n$^+$-InP contact layer 222, a p$^+$-InGaAs emitter layer 218 disposed on the n-InGaAs base layer 220, a p$^+$-InP window layer 216 disposed on the p$^+$-InGaAs emitter layer 218, and a p$^{++}$-InGaAs contact layer 214 disposed on the p$^+$-InP window layer 216.

The lower metal adhesive layer 228, the semiconductor adhesive layer 226, and the upper metal adhesive layer 224 may provide an ohmic contact with the n$^+$-InP contact layer 222. The lower metal adhesive layer 228 may be formed of the same material as the lower electrode layer 228. Specifically, each of the lower metal adhesive layer 228 and the lower electrode layer 228 may be a gold (Au) thin film. The semiconductor adhesive layer 226 may be formed of germanium (Ge). The upper metal adhesive layer 224 may be formed of palladium (Pd).

The n$^+$-InP contact layer 222 may be disposed on the upper metal adhesive layer 224 to collect carriers generated in the n-InGaAs base layer 220.

The n-InGaAs base layer 220 may have a depletion layer region. Carriers (electrons and holes) are mainly generated through light absorption in the depletion layer region. Due to an internal electric field present in a p-n junction interface, electrons migrate toward an n-type semiconductor, and holes drift and migrate toward a p-type semiconductor. The n-InGaAs base layer 220 may include n-In$_{0.53}$Ga$_{0.47}$As.

The p$^+$-InP window layer 216 reduces a recombination rate of the carriers to improve external quantum efficiency. The p$^+$-InP window layer 216 may be formed of a material having a bandgap greater than a bandgap of an emitter semiconductor material. When there is no window layer on an emitter, an emitter material has a significantly high surface recombination rate. Therefore, carriers do not escape to an external circuit and are recombined (carrier recombination) in the emitter to be annihilated.

The p$^{++}$-InGaAs contact layer 214 collects carriers. The p$^{++}$-InGaAs contact layer 214 may include p$^{++}$-In$_{0.53}$Ga$_{0.47}$As.

The GaAs solar cell 101 is disposed on the InGaAs solar cell 201. The vertically stacked double-junction solar cells 10 may generate a parasitic junction. Conventional, a heavily doped p-n tunnel junction is used to reduce the parasitic junction. A rapid thermal process is required to form an ohmic junction of a solar cell electrode layer. During the rapid thermal process, dopants present in a tunnel junction migrate due to thermal diffusion to degrade p-n tunnel junction interfacial characteristics and to form a parasitic junction. However, in a structure of void arrays 129 periodically arranged between the stacked double-junction solar cells according to an example embodiment, an area of a p-n tunnel junction interface decreases by an area of a metal nanodisk array. Thus, thermal diffusion of dopants, generated in the interface, may be reduced to significantly reduce the parasitic junction.

The metal nanodisk array 128 is disposed on an upper surface of the void array. The metal nanodisk array 128 reflects a wavelength band of visible light, incident from the GaAs solar cell 101 in a direction of the GaAs solar cell 101, and transmits an infrared wavelength band. In addition, the metal nanodisk array 128 reflects a wavelength band of infrared light incident from the InGaAs solar cell 201 in a direction of the InGaAs solar cell 201.

The GaAs solar cell 101 includes: an n$^+$-GaAs contact layer 124 disposed on the p$^{++}$-InGaAs contact layer 214 of the InGaAs solar cell 201, an n$^+$-InGaP back-surface field layer 122 disposed on the n$^+$-GaAs contact layer 124, an n-GaAs base layer 120 disposed on the n$^+$-InGaP back surface field layer 122, a p$^+$-GaAs emitter layer 118 disposed on the n-GaAs base layer 120, a p$^+$-InGaP window layer 116 disposed on the p$^+$-GaAs emitter layer 118, and a p$^+$-GaAs contact layer 114 disposed on the p$^+$-InGaP window layer 116.

The metal nanodisk array 128 is disposed on a lower surface of the n$^+$-GaAs contact layer 124, and the void array 129 is disposed between the p$^{++}$-InGaAs contact layer 214 and the metal nanodisk array 128.

The n$^+$-InGaP back surface field layer 122 prevents minority carriers from be recombined with majority carriers in the n$^+$-GaAs contact layer 124 by an interfacial electric field. The n$^+$-InGaP back surface field layer 122 may include n$^+$-In$_{0.49}$Ga$_{0.51}$P. The p$^+$-InGaP window layer 116 may include p$^+$-In$_{0.49}$Ga$_{0.51}$P.

The n-GaAs contact layer 124 may include holes arranged in a lower surface thereof in a matrix form. The holes do not penetrate through the n$^+$-GaAs contact layer. Metal nanodisks may be disposed on upper surfaces of the holes, respectively. Accordingly, the metal nanodisks may constitute the metal nanodisk array 128. The metal nanodisk may have a void on a lower side thereof without filling all of the holes.

The metal nanodisk array 128 may include gold (Au). The metal nanodisk array 128 may have a thickness of 40 nm to 60 nm. The metal nanodisk array 128 may have a period of 50 nm to 200 nm. The metal nanodisk array may have a diameter of 30 nm to 120 nm. The void array 129 may have a thickness of 40 nm to 60 nm. The void array 129 may be maintained in a vacuum state.

The thickness of the void array 129 may be appropriately adjusted by adjusting a depth of inductively coupled plasma etching or a depth of the metal nanodisk array 128 to embed the metal nanodisk array 128. Thus, an effective refractive index of a metal nanodisk-void interface may be modulated, and a wavelength of a band of infrared light, incident from the InGaAs solar cell 201, may be effectively reflected.

The $p^+$-GaAs contact layer 114 may include a depressed portion 114a. The depressed portion 114a may expose the $p^+$-InGaP window layer 116. An antireflective coating film 115 may fill the depressed portion 114a. The antireflective coating film 115 may include ZnS or $MgF_2$.

The upper electrode layer 111 may be disposed on the $p^+$-GaAs contact layer 114. The upper electrode layer 111 may provide an ohmic junction with the $p^+$-GaAs contact layer 114 and may have a finger pattern. The upper electrode layer may be aligned with the $p^+$-GaAs contact layer 114 and may have a finger pattern. The upper electrode layer 111 may form an ohmic junction by depositing an AuZn/Ni/Au multilayer metal layer and annealing the deposited AuZn/Ni/Au multilayer metal layer under a nitrogen atmosphere at a temperature ranging from 280 to 300 degree Celsius for several minutes.

The upper electrode layer 111 may be connected to an external circuit.

FIGS. 2A to 2E are cross-sectional views illustrating a method of manufacturing a GaAs solar cell according to an example embodiment.

Referring to FIGS. 2A to 2E, a method of manufacturing the GaAs solar cell 101 will be described. GaAs solar cell epitaxy is grown using a thin film epitaxy technique such as metalorganic chemical vapor deposition (MOCVD) or molecular beam epitaxy (MBE). The GaAs buffer layer 112 is formed on an $n^+$-GaAs substrate 110. The $n^+$-GaAs substrate 110 may be doped with n-type dopants, but may or may not be doped with p-type dopants. An AlAs sacrificial layer 113, grown with lattice matching, is formed on a GaAs buffer layer 112. A $p^+$-GaAs contact layer 114, a $p^+$-InGaP window layer 116, a $p^+$-GaAs emitter layer 118, an n-GaAs base layer 120, an $n^+$-InGaP back surface field layer 122, and an $n^+$-GaAs contact layer 124 are sequentially formed on the AlAs sacrificial layer 113.

Figure 2A:
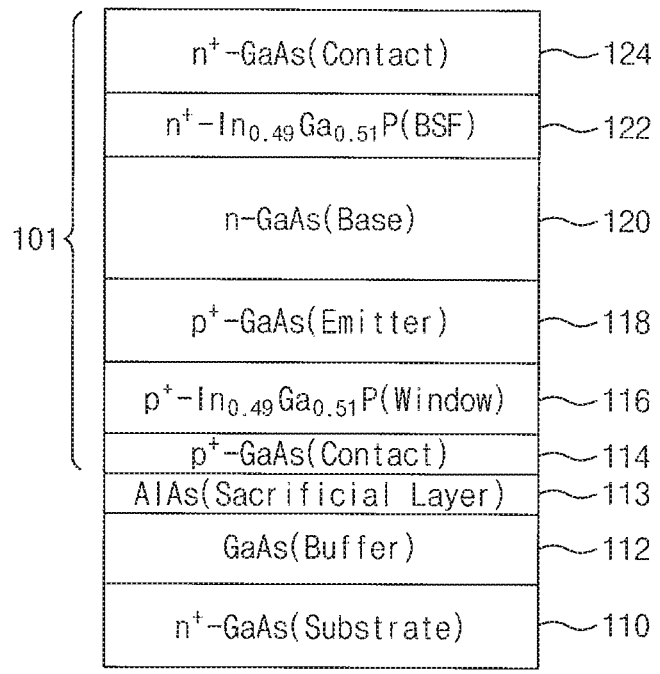
FIGS. 2A to 2E are cross-sectional views illustrating a method of manufacturing a GaAs solar cell according to an example embodiment of the present disclosure.
Figure 2B:
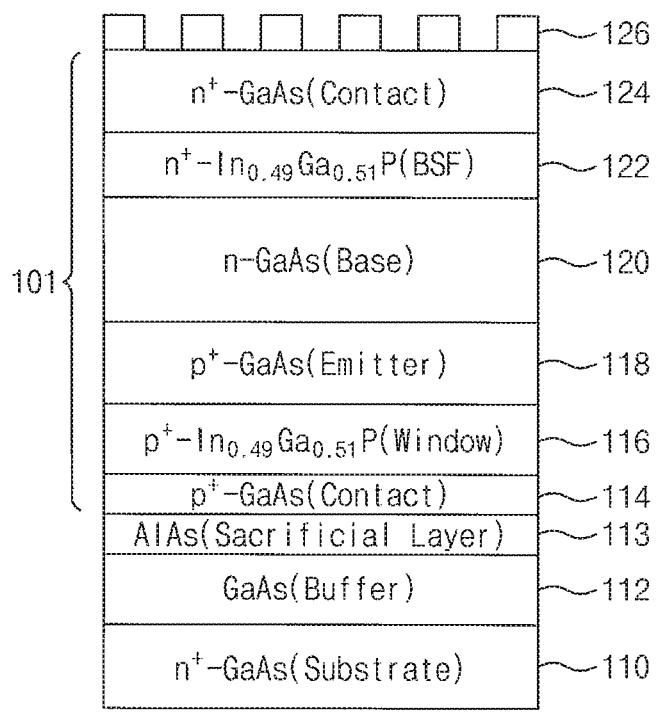

Referring to FIG. 2B, a resist mask pattern 126 is formed on the n-GaAs contact layer 124 through a patterning process. The patterning process may be performed by photolithography, electron beam lithography, nanoimprinting lithography, or laser interference lithography. The resist mask pattern 126 may be in the form of a periodically arranged matrix.

Figure 2C:
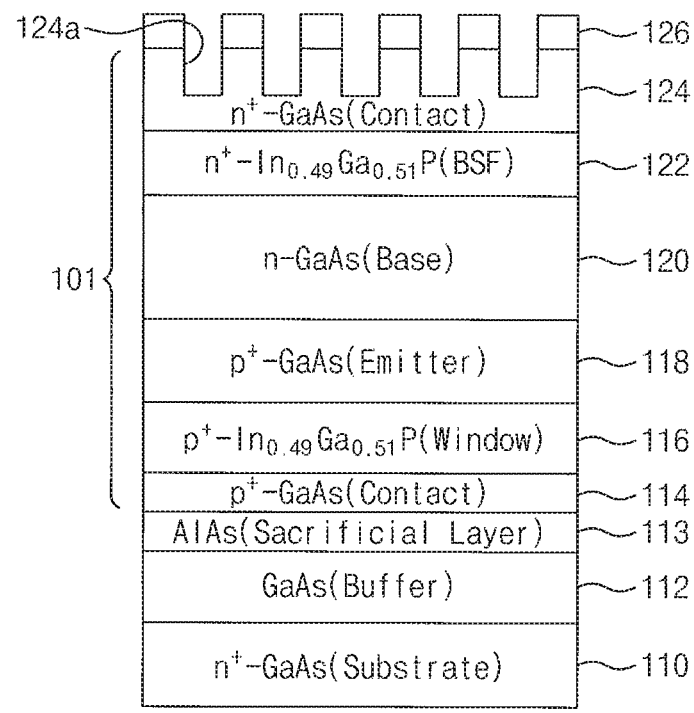

Referring to FIG. 2C, anisotropic etching may be performed using the resist mask pattern 126 as an etching mask. Thus, a hole array 124a may be formed in the $n^+$-GaAs contact layer 126. The anisotropic etching may be performed using an inductively coupled plasma etching apparatus.

Figure 2D:
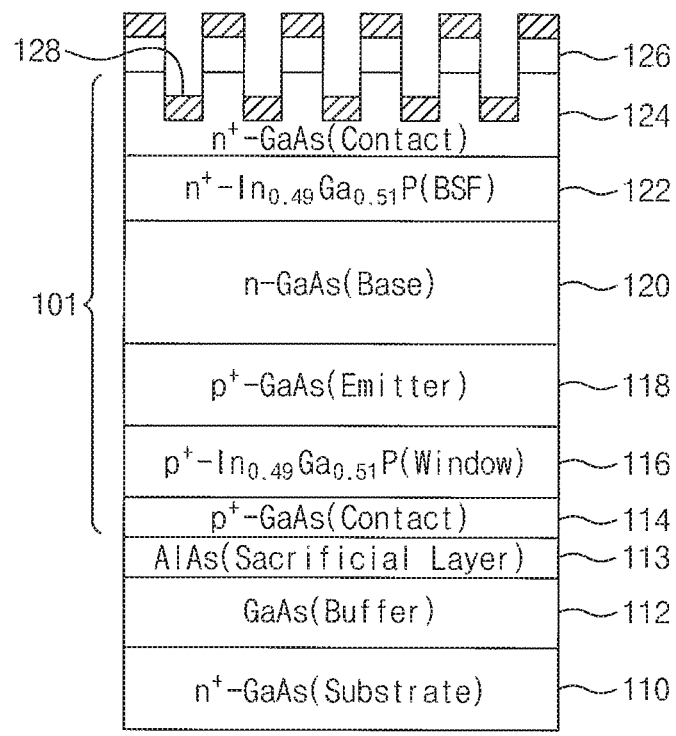
Figure 2E:
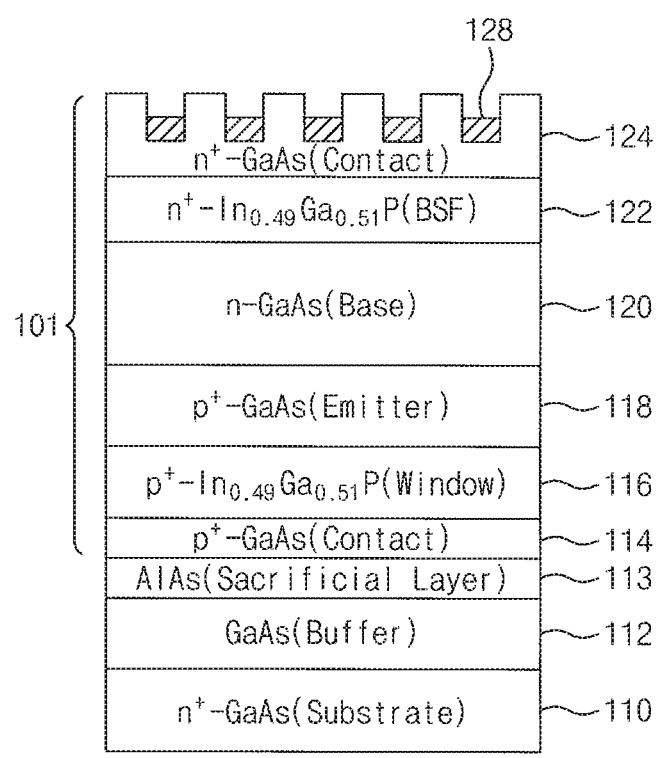

Referring to FIGS. 2D and 2E, a metal thin film is deposited on the $n^+$-GaAs substrate 110 where the resist mask pattern 126 is formed, and then the resist mask pattern 126 is removed by wet etching. The metal thin film may be formed by means of electron beam deposition. A material of the metal thin film may be gold (Au). Accordingly, a lower surface of the hole array 124a may be filled with a metal thin film. Specifically, when a lift-off process is performed using an acetone solution, a gold nanodisk array 128 may be formed on the $n^+$-GaAs contact layer 124 of the GaAs solar cell 101.

FIGS. 3A to 3E are cross-sectional views illustrating a method of manufacturing an InGaAs solar cell according to an example embodiment.

Figure 3A:
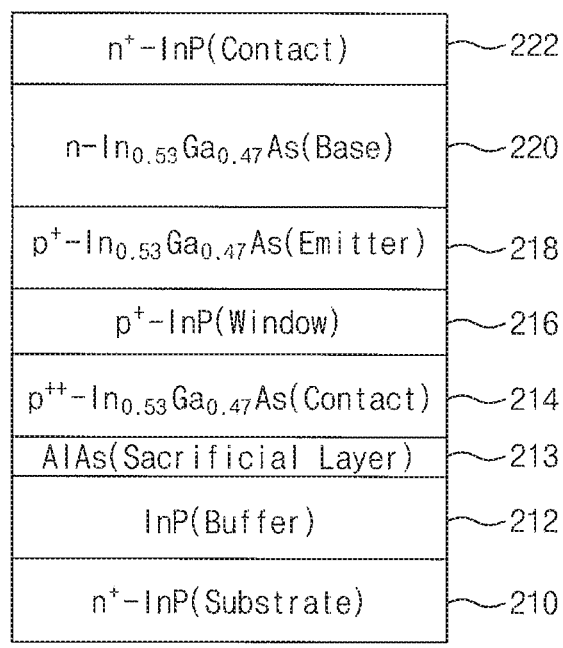
FIGS. 3A to 3E are cross-sectional views illustrating a method of manufacturing an InGaAs solar cell according to an example embodiment of the present disclosure.

Referring to FIG. 3A, a method of manufacturing InGaAs solar cell 201 will be described. InGaAs solar cell epitaxy is grown using a thin film epitaxy technique such as metalorganic chemical vapor deposition (MOCVD) or molecular beam epitaxy (MBE).

An InP buffer layer 212 is formed on an $n^+$-InP substrate 210. An AlAs auxiliary sacrificial layer 213, a $p^{++}$-InGaAs contact layer 214, a $p^+$-InP window layer 216, a $p^+$-InGaAs emitter layer 218, an n-InGaAs base layer 220, and an $n^+$-InP contact layer 222 are sequentially formed on the InP buffer layer 212.

Figure 3B:
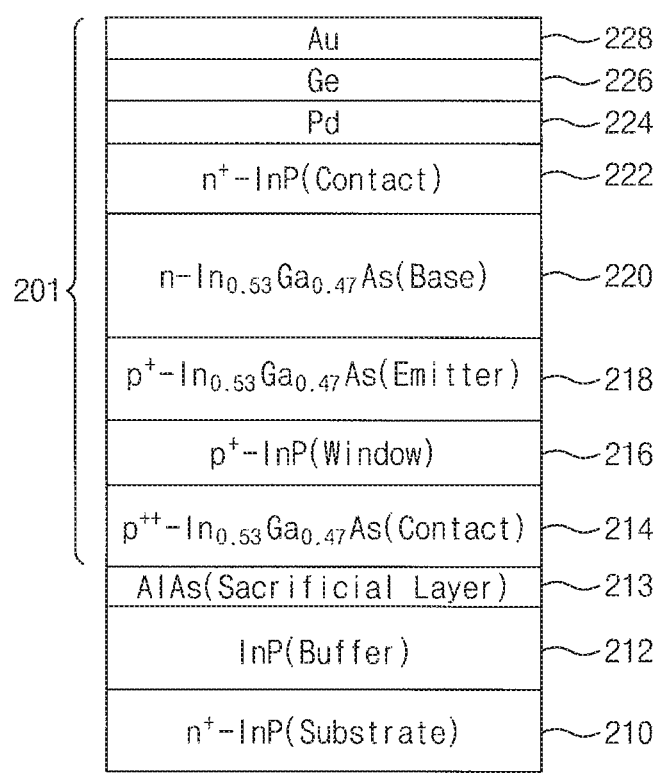

Referring to FIG. 3B, an upper metal adhesive layer 224, a semiconductor adhesive layer 226, and a lower metal adhesive layer 228 are sequentially stacked on the $n^+$-InP contact layer 222. A rapid thermal process may be performed after deposition of the upper metal adhesive layer 224, the semiconductor adhesive layer 226, and the lower metal adhesive layer 228. The rapid thermal process may be performed at a temperature of 300 to 400 degrees Celsius under a nitrogen atmosphere lower than or equal to an atmospheric pressure within a few minutes. Thus, the upper metal adhesive layer 224, the semiconductor adhesive layer 226, and the lower metal adhesive layer 228 may form an ohmic junction together with the $n^+$-InP contact layer 222. The upper metal adhesive layer 224 may include palladium (Pd), the semiconductor adhesive layer 226 may include germanium (Ge), and the lower metal adhesive layer 228 may include gold (Au).

Figure 3C:
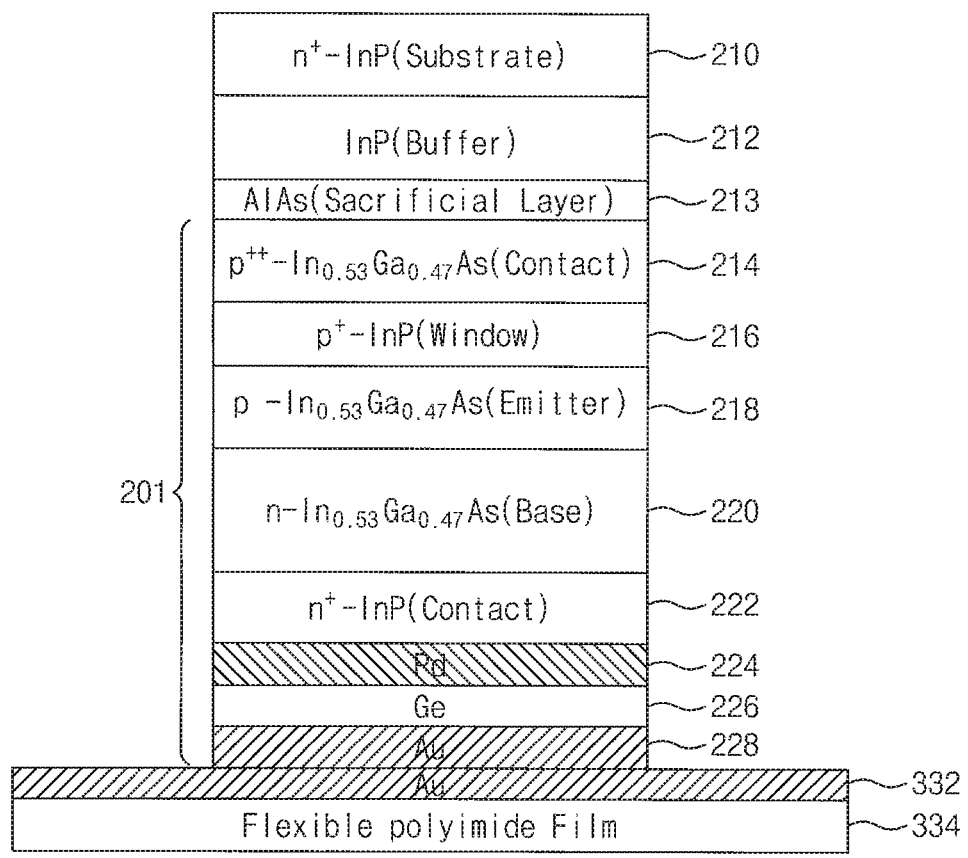

Referring to FIG. 3C, a flexible substrate 334 including the lower electrode layer 332 is prepared. The lower electrode layer 332 may be a gold thin film, and the flexible substrate 334 may be a polyimide film.

The $n^+$-InP substrate 210 is turned upside down on the flexible substrate 334 such that the lower electrode layer 332 and the lower metal adhesive layer 228 are bonded to face each other. A pressure of 50 MPa is applied at a temperature of 180 degrees Celsius such that the lower electrode layer 332 and the lower metal adhesive layer 228 are bonded to each other. Bonding of the lower electrode layer 332 and the lower metal adhesive layer 228 may be performed using a conventional wafer bonder.

Figure 3D:
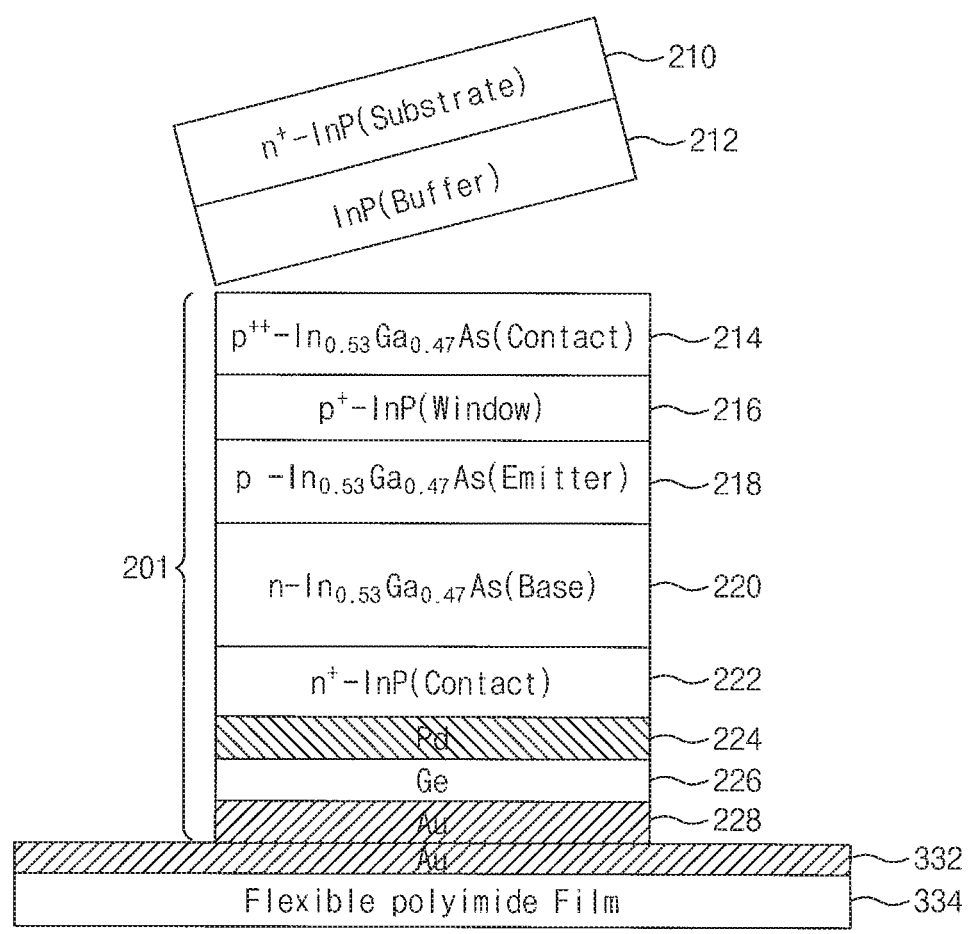
Figure 3E:
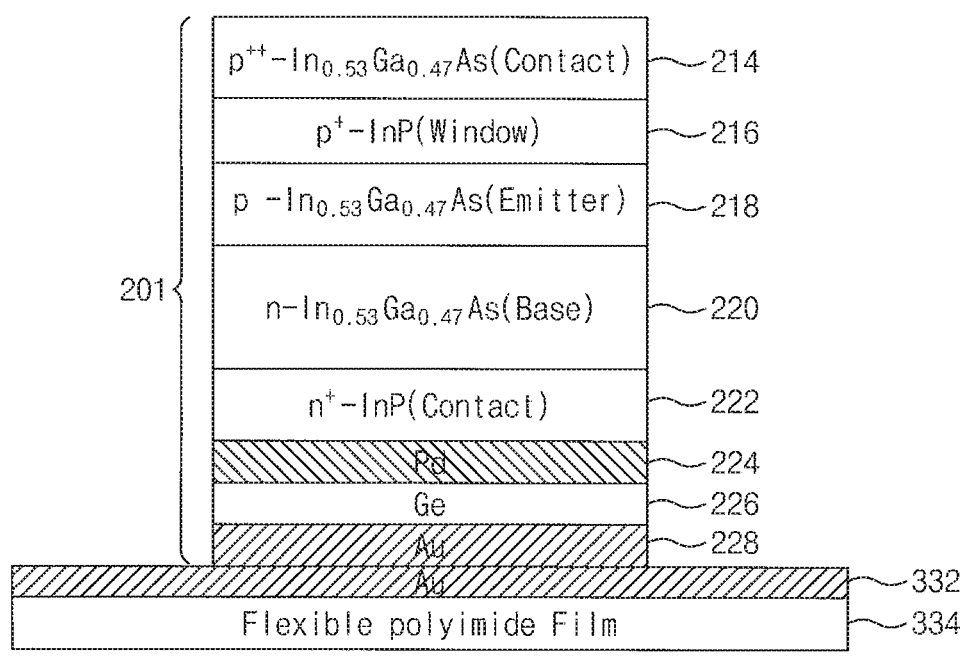

Referring to FIGS. 3D and 3E, in an InGaAs solar cell substrate in which the flexible substrate 334 and the $n^+$-InP substrate 210 are bonded to each other, the AlAs auxiliary sacrificial layer 213 is removed using a hydrofluoric acid (HF) solution diluted in a one-to-five ratio (1:5) of deionized water to HF. That is, an epitaxial lift-off process is performed to separate the $n^+$-InP substrate 210 and the InP buffer layer 212 from the $p^{++}$-InGaAs contact layer 214. As a result, an InGaAs solar cell 201 is provided.

FIGS. 4A to 4F are cross-sectional views illustrating a step of bonding an InGaAs solar cell and a GaAs solar cell according to an example embodiment.

Figure 4A:
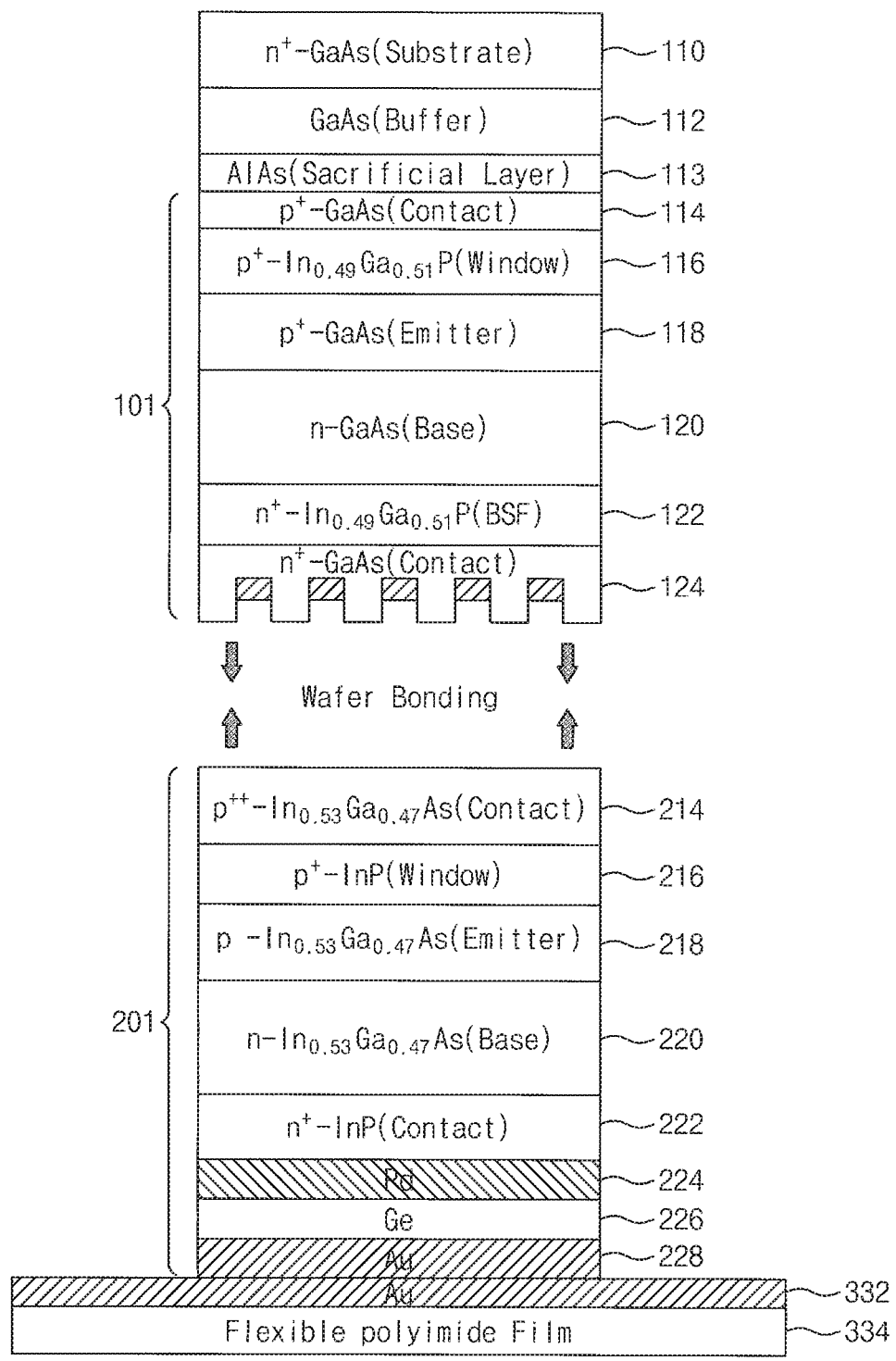
FIGS. 4A to 4F are cross-sectional views illustrating a step of bonding an InGaAs solar cell and a GaAs solar cell according to an example embodiment of the present disclosure.
Figure 4B:
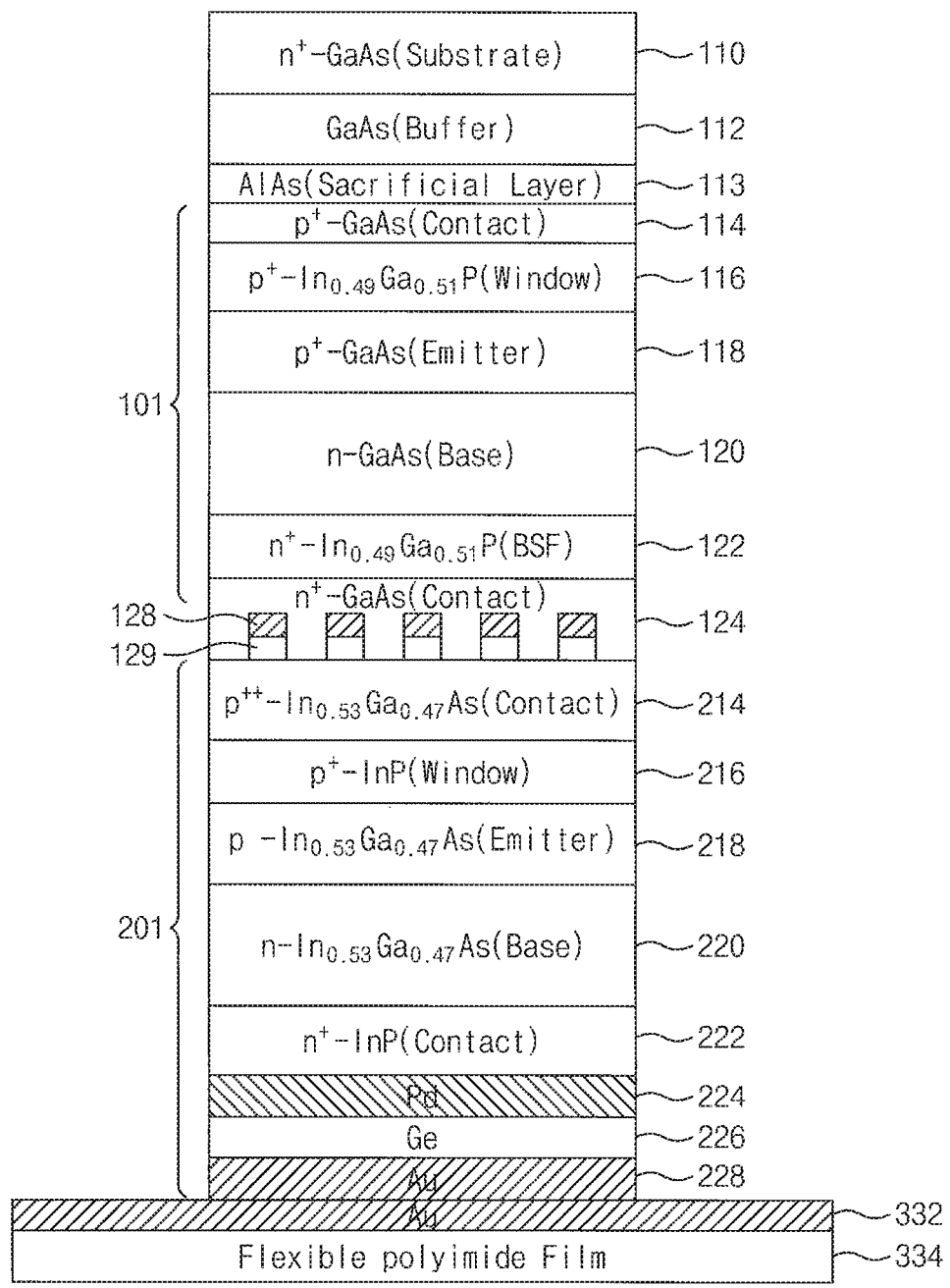

Referring to FIGS. 4A and 4B, a surface of an $n^+$-GaAs contact layer 124 of a GaAs solar cell 101 may be treated using argon or oxygen plasma to be activated before wafer bonding. In addition, a surface of a $p^{++}$-InGaAs contact layer 214 of an InGaAs solar cell 201 may be treated using argon or oxygen plasma to be activated before the wafer bonding.

After the surface treatment using argon plasma, the $n^+$-GaAs contact layer 124 and the metal nanodisk array 128 of the GaAs solar cell 101 is disposed to face the $p^{++}$-InGaAs contact layer 214 of the InGaAs solar cell 201. The wafer bonder performs wafer bonding of the GaAs solar cell 101 and the InGaAs solar cell 201 by applying a pressure of about 50 MPa in a vacuum at room temperature. After the wafer bonding, a void array 129 around the metal nanodisk array may be maintained in a vacuum state.

Figure 4C:
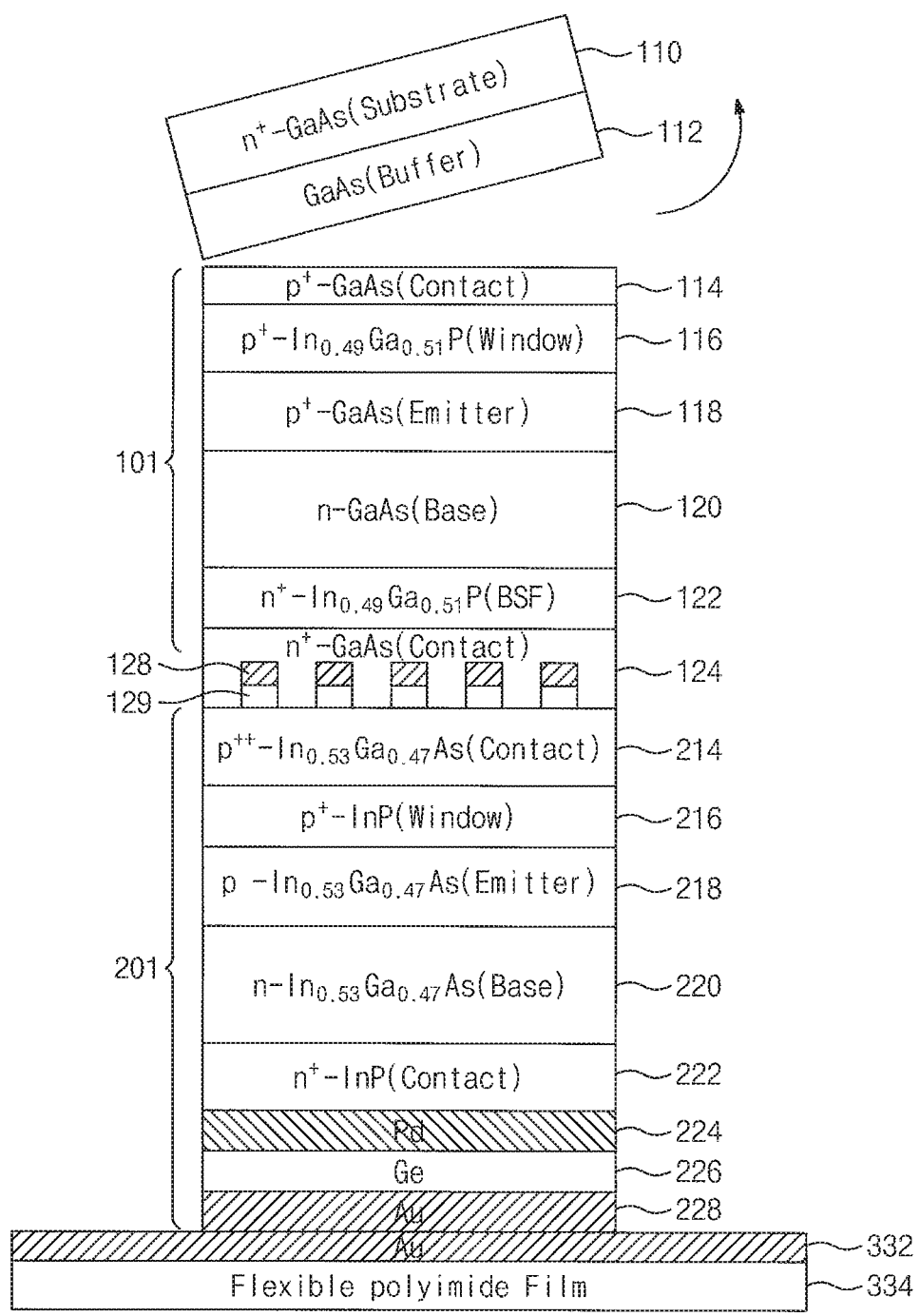
Figure 4D:
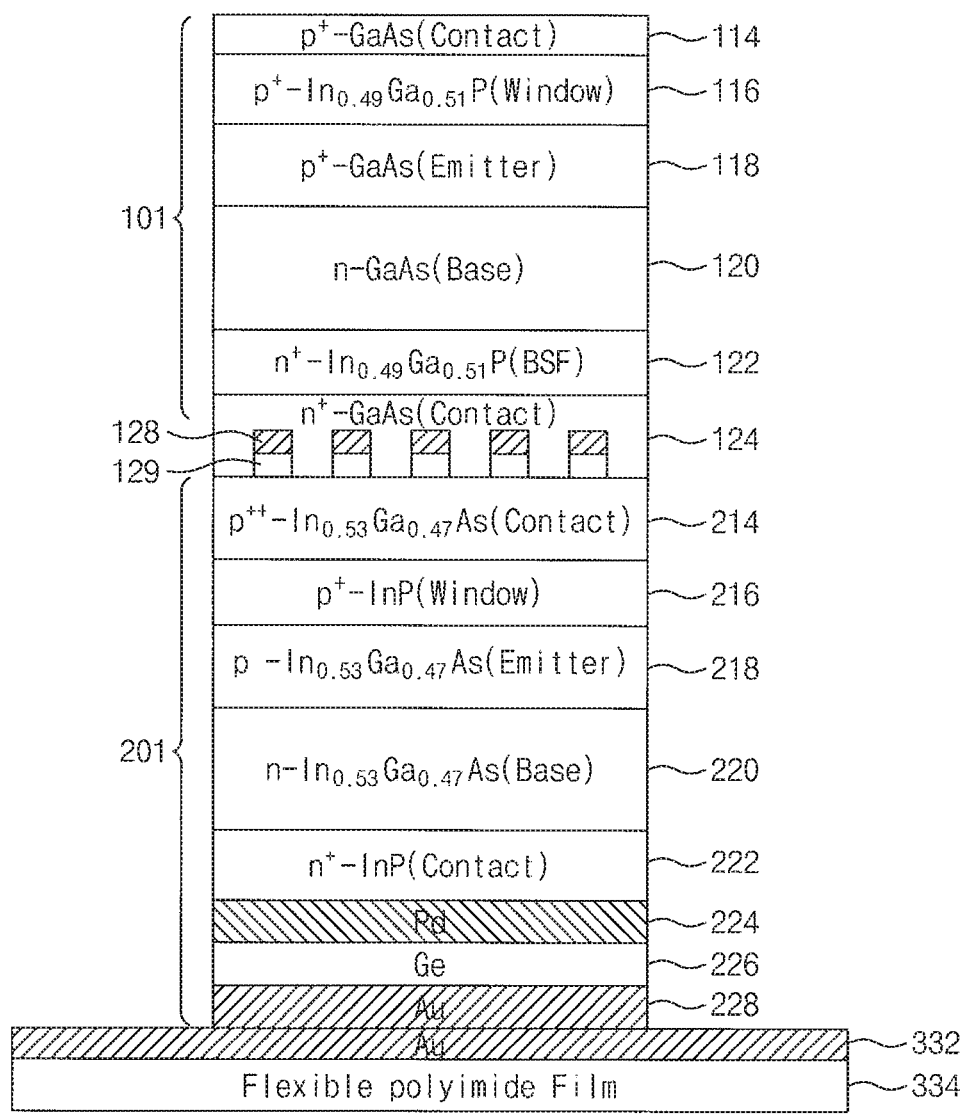

Referring to FIGS. 4C and 4D, in a double-bonded solar cell, the AlAs sacrificial layer of the GaAs solar cell is removed using a hydrofluoric acid (HF) solution diluted in a one-to-five ratio (1:5) of deionized water to HF. That is, an epitaxial lift-off process is performed to separate the $n^+$-GaAs substrate 110 and the GaAs buffer layer 112 from the $p^+$-GaAs contact layer 114.

Figure 4E:
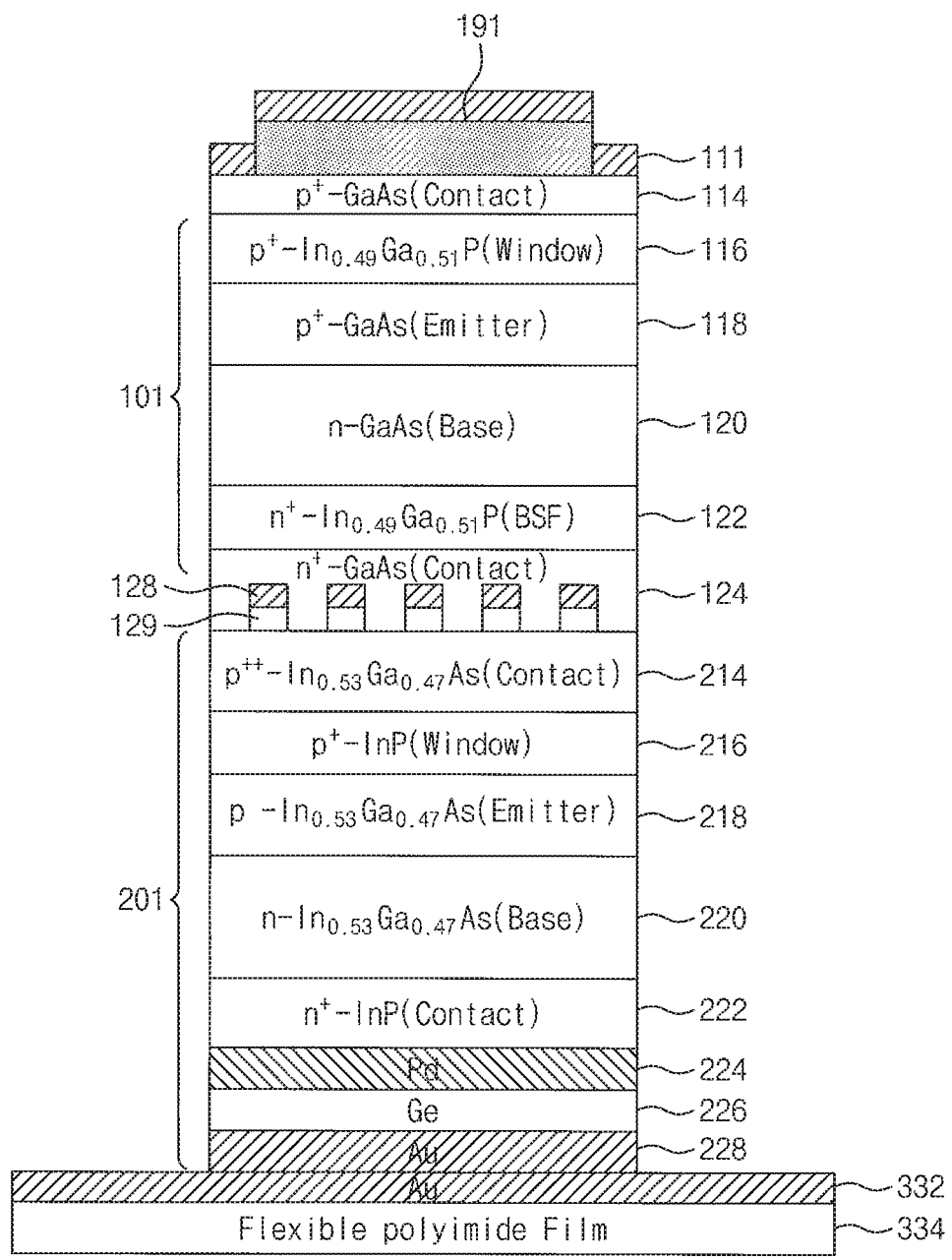
Figure 4F:
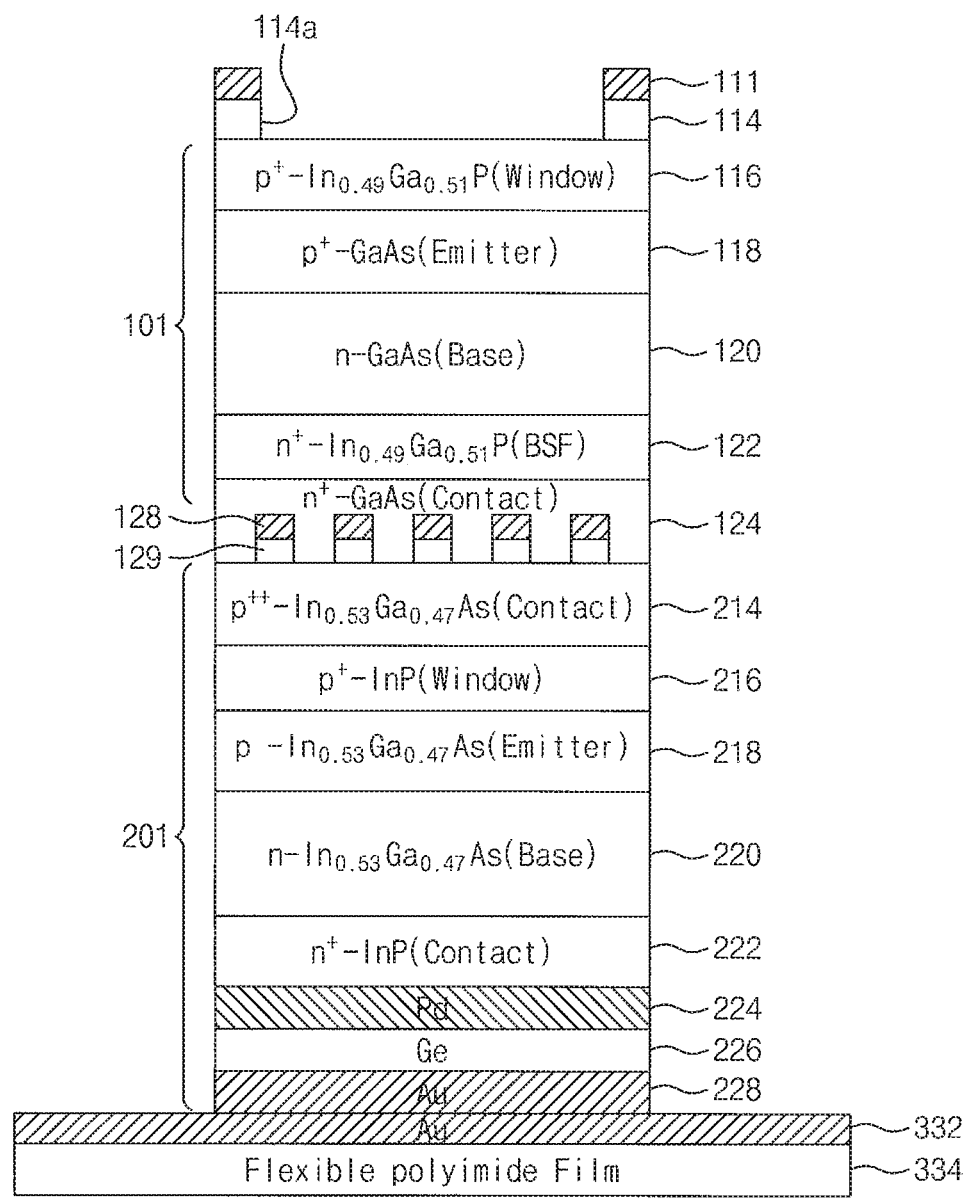

Referring to FIGS. 4E and 4F, a photolithography process may be performed on the $p^+$-GaAs contact layer 114 of the GaAs solar cell 101a to form a photoresist mask 191. A metal thin film may be deposited on a substrate, on which the photoresist mask 191 is formed, to form an upper electrode layer. Then, the photoresist mask 191 may be removed. Accordingly, an upper electrode layer 111 having a shape of a finger pattern may be formed on the $p^+$-GaAs contact layer 114.

Then, a depressed portion 114a may be formed by etching the $p^+$-GaAs contact layer 114 using the upper electrode layer 111 as an etching mask. The depressed portion 114a may expose an upper surface of the $p^+$-InGaP window layer 116.

Returning to FIG. 1, an auxiliary photoresist mask is formed on the upper electrode layer 111 using a photolithography process. Then, a thin film 115 for forming an antireflective coating film may be deposited. The thin film 115 may include ZnS or $MgF_2$. The auxiliary photoresist mask may be then removed. The antireflective coating film 115 may be disposed to be in contact with the $p^+$-InGaP window layer 116 and may fill the depressed portion 114a. The antireflective coating film 115 may significantly reduce reflection of sunlight. The antireflective coating film 115 may include ZnS or $MgF_2$.

Figure 5:
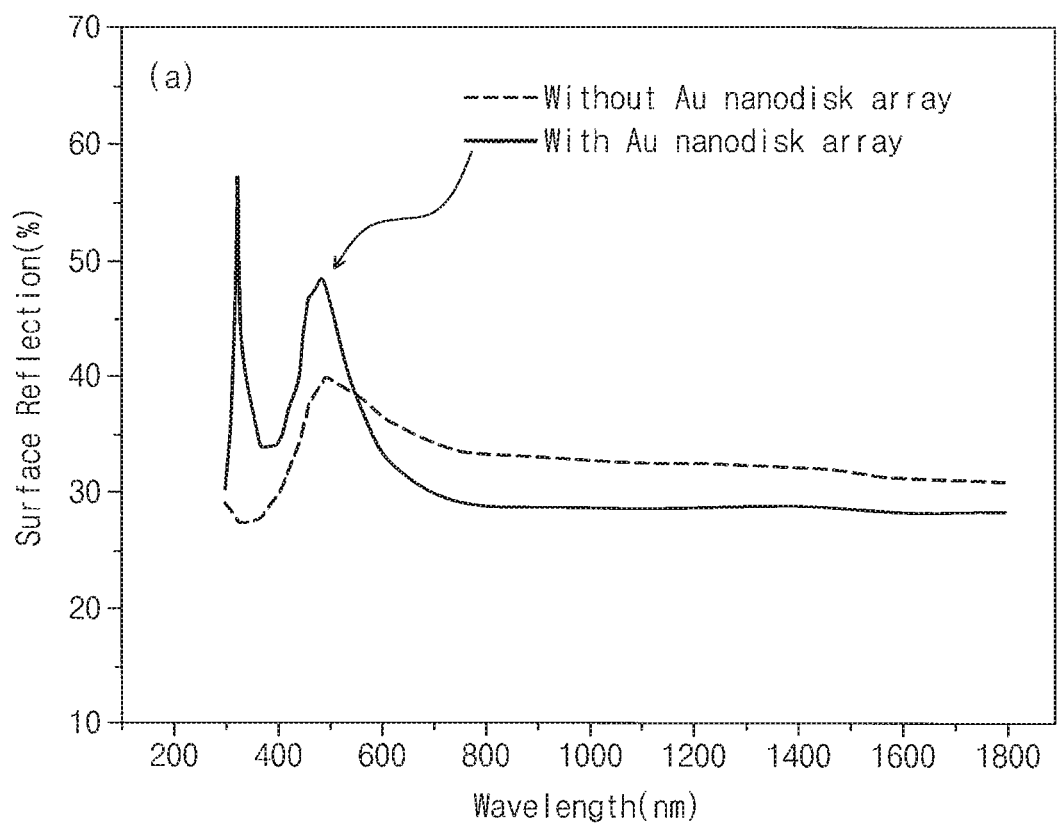
FIG. 5 illustrates a simulation result indicating surface reflectance depending on a wavelength of a flexible double-junction solar cell according to an example embodiment.

FIG. 5 illustrates a simulation result indicating surface reflectance depending on a wavelength of a flexible double-junction solar cell according to an example embodiment.

Referring to FIG. 5, metal nanodisk arrays are arranged in a matrix form and have a period of 100 nm. The metal nanodisk array may have a diameter of 60 nm and a thickness of 50 nm. Under this condition, a finite difference time domain (FDTD) method was used to simulate a surface reflectance spectrum. In FIG. 5, a graph shows surface reflectances depending on a wavelength when the metal nanodisk array 128 is present between the InGaAs solar cell 201 and the GaAs solar cell 101 and a wavelength when the metal nanodisk array 128 is not present therebetween.

Figure 6:
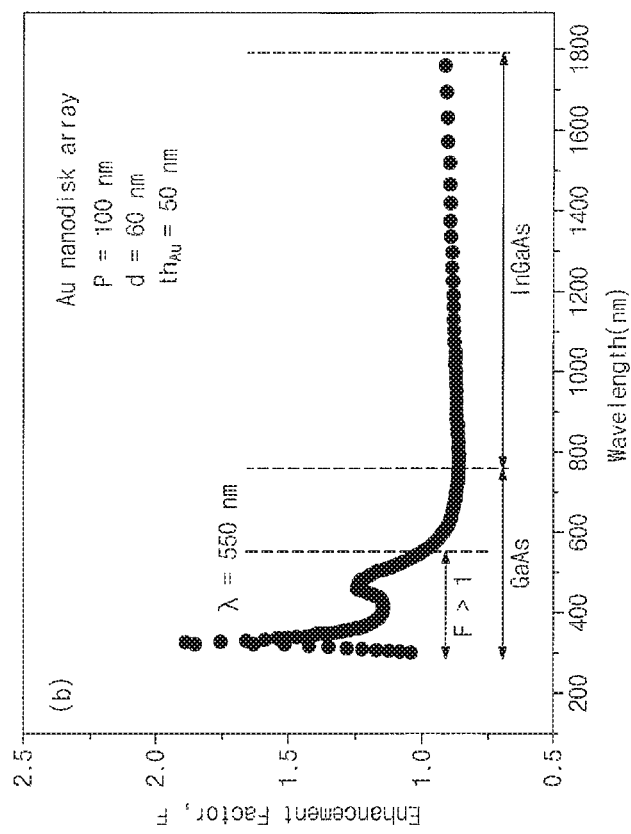
FIG. 6 illustrates the result of FIG. 5 as a surface reflection enhancement factor (F) depending on a wavelength according to presence of a metal nanodisk array.

FIG. 6 illustrates the result of FIG. 5 as a surface reflection enhancement factor (F) depending on a wavelength according to presence of a metal nanodisk array.

Referring to FIG. 6, a surface reflectance enhancement factor (F), obtained by dividing two reflectance values depending on the presence or absence of the metal nanodisk array 128, is shown using the simulation result of FIG. 5. In a wavelength range of 300 nm to 550 nm, reflectance enhancement is increased to be greater than 1, which means that reflectance of a corresponding wavelength is improved by an optical reflection effect of the metal nanodisk array. Reflected light may be reabsorbed by the GaAs solar cell 101, disposed on the metal nanodisk array, to increase light absorption efficiency. In addition, in a region having a wavelength of 780 nm to 1800 nm, a main absorption wavelength of the InGaAs solar cell 201, the reflectance improvement is less than 1 due to a surface plasmon effect of the metal nanodisk array, which means that the reflectance of the wavelength is reduced. As a result, the optical absorption of the InGaAs solar cell 201 may be improved by the reduced reflectance.

As described above, according to an example embodiment, a double-junction solar cell includes a metal nanodisk array and a void, aligned with the metal nanodisk array, to provide improved optical reflection characteristics and improved electrical characteristics.

Although the present disclosure and its advantages have been described in detail, it should be understood that various changes, substitutions and alterations can be made herein without departing from the spirit and scope of the disclosure as defined by the following claims.

What is claimed is:

1. A flexible double-junction solar cell comprising:
   a flexible substrate including a lower electrode layer,
   an InGaAs solar cell disposed to be in contact with the lower electrode layer of the flexible substrate; and
   a GaAs solar cell disposed on the InGaAs solar cell and connected to the InGaAs solar cell in series,
   wherein the GaAs solar cell includes a metal nanodisk array disposed on a lower surface thereof; and
   a void array, aligned with the metal nanodisk array, is disposed below the metal nanodisk array.

2. The flexible double-junction solar cell of claim 1, wherein the InGaAs solar cell comprises:
   a lower metal adhesive layer disposed on the lower electrode layer;
   a semiconductor adhesive layer disposed on the lower metal adhesive layer;
   an upper metal adhesive layer disposed on the semiconductor adhesive layer;
   an n+-InP contact layer disposed on the upper metal adhesive layer;
   an n-InGaAs base layer disposed on the n+-InP contact layer;
   a $p^+$-InGaAs emitter layer disposed on the n-InGaAs base layer,
   a $p^+$-InP window layer disposed on the $p^+$-InGaAs emitter layer; and
   a $p^{++}$-InGaAs contact layer disposed on the $p^+$-InP window layer.

3. The flexible double-junction solar cell of claim 2, wherein the GaAs solar cell comprises:
   an $n^+$-GaAs contact layer disposed on the $p^{++}$-InGaAs contact layer of the InGaAs solar cell;
   an $n^+$-InGaP back-surface field layer disposed on the $n^+$-GaAs contact layer;
   an n-GaAs base layer disposed on the $n^+$-InGaP back surface field layer;
   a $p^+$-GaAs emitter layer disposed on the n-GaAs base layer;
   a $p^+$-InGaP window layer disposed on the $p^+$-GaAs emitter layer; and
   a $p^+$-GaAs contact layer disposed on the $p^+$-InGaP window layer, and
   wherein the metal nanodisk array is disposed on a lower surface of the $n^+$-GaAs contact layer, and the void array is disposed between the $p^{++}$-InGaAs contact layer and the metal nanodisk array.

4. The flexible double-junction solar cell of claim 3, wherein the $p^+$-GaAs contact layer has a depressed portion, and
   the flexible double-junction solar cell further comprises:
   an antireflective coating film filling the depressed portion; and
   an upper electrode layer disposed on the $p^+$-GaAs contact layer.

5. The flexible double-junction solar cell of claim 1, wherein the metal nanodisk array includes gold (Au), the metal nanodisk array has a thickness of 40 nm to 60 nm, the metal nanodisk army has a period 50 nm to 200 nm, and the metal nanodisk array has a diameter of 30 nm to 120 nm.

6. A method of manufacturing a flexible double-junction solar cell, the method comprising:

preparing a GaAs solar cell including a GaAs buffer layer, an AlAs sacrificial layer, a $p^+$-GaAs contact layer, a $p^+$-InGaP window layer, a $p^+$-GaAs emitter layer, an n-GaAs base layer, an $n^+$-InGaP back surface field layer, and an $n^+$-GaAs contact layer on an $n^+$-GaAs substrate;

forming a metal nanodisk array on a lower surface of a hole array in the $n^+$-GaAs contact layer of the GaAs solar cell and forming a void in an upper portion of the metal nanodisk array;

preparing an InGaAs solar cell including an InP buffer layer, an AlAs auxiliary sacrificial layer, a $p^{++}$-InGaAs contact layer, a $p^+$-InP window layer, a $p^+$-InGaAs emitter layer, an n-InGaAs base layer, and an $n^+$-InP contact layer sequentially stacked on an $n^+$-InP substrate;

sequentially stacking an upper metal adhesive layer, a semiconductor adhesive layer, and a lower metal adhesive layer on the $n^+$-InP contact layer of the InGaAs solar cell;

bonding the lower metal adhesive layer, stacked on the InGaAs solar cell, to a flexible substrate including a lower electrode layer;

removing the AlAs auxiliary sacrificial layer of the InGaAs solar cell to expose the $p^{++}$-InGaAs contact layer;

performing wafer bonding on the $p^{++}$-InGaAs contact layer of the InGaAs solar cell to the $n^+$-GaAs contact layer of the GaAs solar cell to form a double-junction solar cell; and removing the AlAs sacrificial layer of the GaAs solar cell from the double-junction solar cell to expose the $p^+$-GaAs contact layer.

7. The method of claim 6, further comprising:

locally forming an upper electrode layer on the $p^+$-GaAs contact layer; and forming an antireflective coating film in a depressed portion where the $p^+$-GaAs contact layer is locally removed.

* * * * *